US012581719B2

(12) United States Patent
Lee et al.

(10) Patent No.: US 12,581,719 B2
(45) Date of Patent: Mar. 17, 2026

(54) FABRICATION OF SILICON GERMANIUM CHANNEL AND SILICON/SILICON GERMANIUM DUAL CHANNEL FIELD-EFFECT TRANSISTORS

(71) Applicant: International Business Machines Corporation, Armonk, NY (US)

(72) Inventors: ChoongHyun Lee, Rensselaer, NY (US); Kangguo Cheng, Schenectady, NY (US); Juntao Li, Cohoes, NY (US); Shogo Mochizuki, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 783 days.

(21) Appl. No.: 17/132,253

(22) Filed: Dec. 23, 2020

(65) Prior Publication Data

US 2021/0111078 A1 Apr. 15, 2021

Related U.S. Application Data

(62) Division of application No. 16/153,020, filed on Oct. 5, 2018, now Pat. No. 10,943,835.

(51) Int. Cl.
H10D 84/03 (2025.01)
H01L 21/02 (2006.01)
(Continued)

(52) U.S. Cl.
CPC ..... H10D 84/038 (2025.01); H01L 21/02236 (2013.01); H01L 21/02532 (2013.01);
(Continued)

(58) Field of Classification Search
CPC .. H10D 84/038; H10D 84/0186; H10D 84/85; H10D 84/0195; H10D 84/0167;
(Continued)

(56) References Cited

U.S. PATENT DOCUMENTS 7,705,345 B2 4/2010 Bedell et al.
9,093,326 B2 * 7/2015 Cheng ................. H01L 27/1211
(Continued)

OTHER PUBLICATIONS

J. Mitard et al., "High-Mobility 0.85nm-EOT Si0.45Ge0.55-pFETs: Delivering High Performance at Scaled VDD," International Electron Devices Meeting (IEDM), Dec. 6-8, 2010, 4 pages.
(Continued)

*Primary Examiner* — Nathan W Ha
(74) *Attorney, Agent, or Firm* — Daniel Yeates; Ryan, Mason & Lewis, LLP

(57) ABSTRACT

A method for manufacturing a semiconductor device includes forming a plurality of fins on a substrate, wherein each fin of the plurality of fins includes silicon germanium. A layer of silicon germanium oxide is deposited on the plurality of fins, and a first thermal annealing process is performed to convert outer regions of the plurality of fins into a plurality of silicon portions. Each silicon portion of the plurality of silicon portions is formed on a silicon germanium core portion. The method further includes forming a plurality of source/drain regions on the substrate, and depositing a layer of germanium oxide on the plurality of source/drain regions. A second thermal annealing process is performed to convert outer regions of the plurality of source/drain regions into a plurality of germanium condensed portions.

20 Claims, 14 Drawing Sheets

(51) Int. Cl.

| | |
|---|---|
| *H01L 21/324* | (2006.01) |
| *H01L 21/74* | (2006.01) |
| *H01L 21/768* | (2006.01) |
| *H01L 23/535* | (2006.01) |
| *H10D 30/01* | (2025.01) |
| *H10D 30/63* | (2025.01) |
| *H10D 30/69* | (2025.01) |
| *H10D 62/10* | (2025.01) |
| *H10D 62/17* | (2025.01) |
| *H10D 62/832* | (2025.01) |
| *H10D 84/01* | (2025.01) |
| *H10D 84/85* | (2025.01) |

(52) U.S. Cl.
CPC .... *H01L 21/02636* (2013.01); *H01L 21/3247* (2013.01); *H01L 21/74* (2013.01); *H01L 21/76895* (2013.01); *H01L 23/535* (2013.01); *H10D 30/025* (2025.01); *H10D 30/63* (2025.01); *H10D 30/751* (2025.01); *H10D 62/115* (2025.01); *H10D 62/378* (2025.01); *H10D 62/832* (2025.01); *H10D 84/0167* (2025.01); *H10D 84/017* (2025.01); *H10D 84/0186* (2025.01); *H10D 84/0188* (2025.01); *H10D 84/0191* (2025.01); *H10D 84/0195* (2025.01); *H10D 84/85* (2025.01)

(58) Field of Classification Search
CPC ............. H10D 84/017; H10D 84/0191; H10D 30/751; H10D 30/63; H01L 21/02236; H01L 21/02532; H01L 21/02636; H01L 21/3247; H01L 21/74; H01L 23/535
See application file for complete search history.

(56) References Cited

U.S. PATENT DOCUMENTS

| | | | |
|---|---|---|---|
| 9,306,063 | B2 | 4/2016 | Doyle et al. |
| 9,418,900 | B1 | 8/2016 | He et al. |
| 9,484,347 | B1 | 11/2016 | Cheng et al. |
| 9,502,265 | B1 | 11/2016 | Jiang et al. |
| 9,583,626 | B2 | 2/2017 | Cheng et al. |
| 9,595,449 | B1 | 3/2017 | Jagannathan et al. |
| 9,773,875 | B1 | 9/2017 | Jagannathan et al. |
| 9,947,663 | B2 | 4/2018 | Basker et al. |
| 2018/0053848 | A1 | 2/2018 | Balakrishnan et al. |
| 2020/0111714 | A1 | 4/2020 | Lee et al. |

OTHER PUBLICATIONS

C. Lee et al., "Engineering the Electronic Defect Bands at the Si1-xGex/IL Interface: Approaching the Intrinsic Carrier Transport in Compressively-Strained Si1-xGex pFETs," International Electron Devices Meeting (IEDM), Dec. 3-7, 2016, 4 pages.

P. Hashemi et al., "High Performance and Reliable Strained SiGe PMOS FinFETs Enabled by Advanced Gate Stack Engineering," International Electron Devices Meeting (IEDM), Dec. 2-6, 2017, 4 pages.

C.H. Lee et al., "Selective GeOx-Scavenging from Interfacial Layer on Si1-xGex Channel for High Mobility Si/Si1-xGex CMOS Application," IEEE Symposium on VLSI Technology, Jun. 14-16, 2016, 2 pages.

List of IBM Patents or Patent Applications Treated as Related.

* cited by examiner

FABRICATION OF SILICON GERMANIUM CHANNEL AND SILICON/SILICON GERMANIUM DUAL CHANNEL FIELD-EFFECT TRANSISTORS

TECHNICAL FIELD

The field generally relates to semiconductor devices and methods of manufacturing same and, in particular, to forming field effect transistors (FETs) using annealing processes which cause germanium oxide reactions.

BACKGROUND

Fin field-effect transistor (FinFET) devices include a transistor architecture that uses raised source-to-drain channel regions, referred to as fins. A FinFET device can be built on a semiconductor substrate, where a semiconductor material is patterned into fin-like shapes and functions as the channels of the transistors. Known FinFET devices include fins with source/drain regions on lateral sides of the fins, so that current flows in a horizontal direction (e.g., parallel to a substrate) between source/drain regions at opposite ends of the fins in the horizontal direction. Vertical field-effect transistors (VFETs) (also referred to as vertical transport FETs (VTFETs)) include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

Transistors with silicon germanium (SiGe) channels can provide superior gate stack reliability, improvements to negative bias temperature instability (NBTI), and threshold voltage tunability. Combining VTFETs and SiGe channels can be a promising future technology. However, there are still obstacles in the development of SiGe channel VTFETs. For example, unwanted germanium (Ge) pile-up at the SiGe fin surfaces occurs where Ge undesirably accumulates at fin surfaces, which may degrade SiGe channel device performance. In addition, with conventional methods, uniform epitaxial growth of an ultrathin silicon (Si) cap layer on a SiGe fin is not possible because of orientation dependent growth rate and fin roughness. Additionally, in order to improve contact resistivity in a p-type-doped SiGe layer, high-Ge-content SiGe is required (e.g., in the range of 60% Ge to 80% Ge). However, high-Ge-content SiGe layers are not thermally stable and are often modified during multiple high temperature annealing steps.

Dual channel devices include devices with different channel materials (e.g., Si and SiGe) on the same substrate. Hydrogen ($H_2$) annealing on dual channel FinFETs results in asymmetric device performance. For example, $H_2$ annealing improves device performance for a Si nFET and degrades performance of a SiGe pFET. For example, $H_2$ annealing improves nFET long channel (LC) mobility (e.g., in devices with >100 nm channel length) and Slin (sub-threshold slope at low drain bias (Vd ~50 mv)), and degrades pFET LC mobility and Slin possibly due to Ge pile-up at SiGe fin surfaces.

Accordingly, there is a need for improved fabrication techniques of silicon germanium channel and silicon/silicon germanium dual channel devices, which do not degrade performance of SiGe channels.

SUMMARY

According to an exemplary embodiment of the present invention, a method for manufacturing a semiconductor device includes forming a plurality of fins on a substrate, wherein each fin of the plurality of fins includes silicon germanium. A layer of silicon germanium oxide is deposited on the plurality of fins, and a first thermal annealing process is performed to convert outer regions of the plurality of fins into a plurality of silicon portions. Each silicon portion of the plurality of silicon portions is formed on a silicon germanium core portion. The method further includes forming a plurality of source/drain regions on the substrate, and depositing a layer of germanium oxide on the plurality of source/drain regions. A second thermal annealing process is performed to convert outer regions of the plurality of source/drain regions into a plurality of germanium condensed portions.

According to an exemplary embodiment of the present invention, a semiconductor device includes a plurality of fins and a plurality of source/drain regions on a substrate. Each fin of the plurality of fins includes a plurality of silicon portions, wherein each silicon portion of the plurality of silicon portions is disposed on a silicon germanium core portion. Each of the plurality of source/drain regions includes a germanium condensed surface formed on a doped silicon germanium portion.

According to an exemplary embodiment of the present invention, a method for manufacturing a semiconductor device includes forming a first fin on a semiconductor substrate in a first type region, and forming a second fin on the semiconductor substrate in a second type region. The first fin includes a silicon channel and a first punch-through stop layer under the silicon channel, the second fin includes a silicon germanium channel and a second punch-through stop layer under the silicon germanium channel. In the method, an isolation region is formed on the semiconductor substrate adjacent the first and second fins, and a dummy dielectric layer is formed on the silicon and silicon germanium channels and on portions of the isolation region adjacent the silicon and silicon germanium channels. The dummy dielectric layer is removed from at least part of the silicon channel and from a portion of the isolation region adjacent the silicon channel, and a thermal annealing process is performed to smooth the silicon channel. The method further includes removing the dummy dielectric layer from at least part of the silicon germanium channel and from a portion of the isolation region adjacent the silicon germanium channel. A resulting height of the isolation region in the first type region is less than a height of the isolation region in the second type region.

According to an exemplary embodiment of the present invention, a semiconductor device includes a first fin disposed on a semiconductor substrate in a first type region, and a second fin disposed on the semiconductor substrate in a second type region. The first fin includes a silicon channel and a first punch-through stop layer under the silicon channel, and the second fin includes a silicon germanium channel and a second punch-through stop layer under the silicon germanium channel. An isolation region is disposed on the semiconductor substrate adjacent the first and second fins. A height of the isolation region in the first type region is less than a height of the isolation region in the second type region.

According to an exemplary embodiment of the present invention, a method for manufacturing a semiconductor device includes forming a fin having silicon germanium on a substrate, and forming germanium oxide on the fin. In the method, a thermal annealing process is performed to cause a chemical reaction with the germanium oxide to remove germanium atoms from a surface of the fin.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
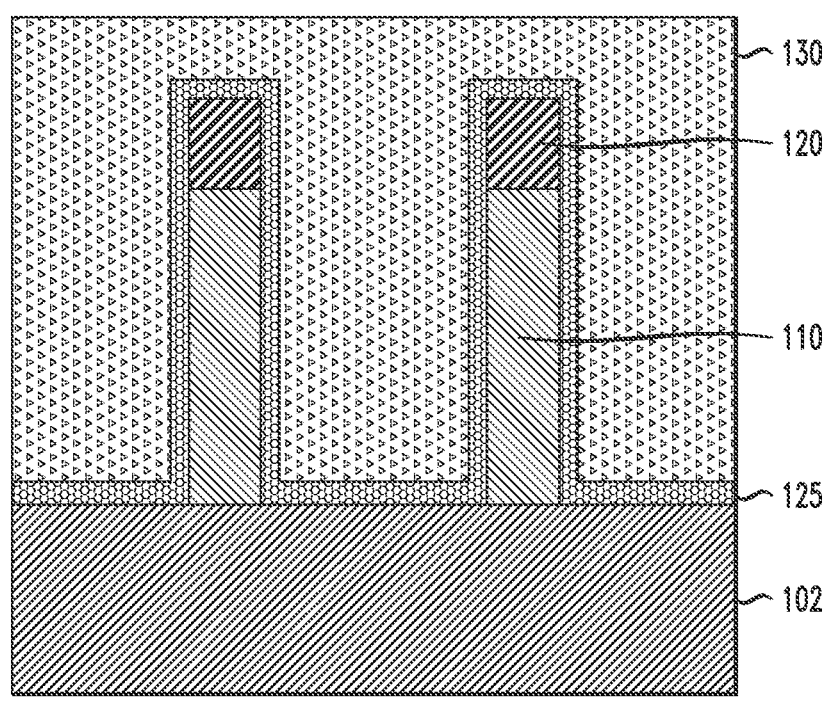
FIG. 1 is a cross-sectional view illustrating fin formation, and silicon germanium oxide ($SiGeO_x$) and cap layer deposition in a method of manufacturing a semiconductor device, according to an exemplary embodiment of the present invention.

Exemplary embodiments of the invention will now be discussed in further detail with regard to semiconductor devices and methods of manufacturing same and, in particular, to fabrication techniques for silicon germanium channel and silicon/silicon germanium dual channel devices, which improve performance of the devices.

It is to be understood that the various layers and/or regions shown in the accompanying drawings are not drawn to scale, and that one or more layers and/or regions of a type commonly used in, for example, FET, FinFET, VFET, CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, VFETs, CMOSs, nanowire FETs, nanosheet FETs, SETs, and/or MOSFETs. By way of non-limiting example, the semiconductor devices can include, but are not necessarily limited to FET, FinFET, VFET, CMOS, nanowire FET, nanosheet FET, SET, CMOS and MOSFET devices, and/or semiconductor devices that use FET, FinFET, VFET, CMOS, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

An embodiment of the present invention corresponds to a method and structure of fabricating a SiGe channel VTFET, which has a Si-rich surface in the channel and Ge-rich surface in the source/drain region. A Si-rich surface in the SiGe channel improves the gate stack and a Ge-rich surface in the source/drain region lowers the contact resistivity, resulting in improvement of device performance.

In accordance with an embodiment of the present invention, a $SiGeO_x$ layer reacts with the surfaces of SiGe fins during a high temperature spike anneal process, which results in Si-rich surfaces on the fins without changing the fin profiles. An embodiment of the present invention further uses a $GeO_2$ sacrificial layer to selectively condense germanium in p-type doped SiGe source/drain regions at relatively low temperature (e.g., <500° C.), which provides the low contact resistivity. According to an embodiment of the present invention, a Si/Ge gradient profile in the channel and source/drain regions is produced. In addition, SiGe gate stacks are improved due to Si-rich surface formation on SiGe fins, and high Ge content surface formation at top and bottom source/drain layers results in low contact resistivity.

Another embodiment of the present invention corresponds to the utilizing staggered removal of dummy oxide layers from channels having different materials (e.g., Si and SiGe) and corresponding $H_2$ annealing processes in dual channel devices in order to improve Si/SiGe FinFETs. More specifically, a first $H_2$ anneal is performed on a Si nFET after dummy oxide removal from the Si channel (e.g., fin), while a dummy oxide layer remains in a SiGe pFET region, and a second $H_2$ anneal is carried out after dummy oxide removal from the SiGe pFET region and interfacial layer formation on both Si and SiGe channels (e.g., fins). The first $H_2$ anneal smooths the Si channel, and the second $H_2$ anneal selectively scavenges $GeO_x$ from the interfacial layer on the SiGe channel. There is no reaction at the interface of the interfacial layer and Si channel during the second $H_2$ anneal.

According to an embodiment of the present invention, for the dual channel device, a Si nFET and SiGe pFET have different isolation region (e.g., shallow trench isolation (STI) region) thicknesses from each other. In addition, due to the smaller thickness of the isolation region in the nFET region, a punch-through stop (PTS) layer for the Si nFET extends deeper into the gate structure than the PTS layer of the SiGe pFET, which prevents parasitic channel formation at the bottom of the channel in the nFET region.

FIG. 1 is a cross-sectional view illustrating fin formation, and silicon germanium oxide ($SiGeO_x$) and cap layer deposition in a method of manufacturing a semiconductor device, according to an exemplary embodiment of the present invention. A semiconductor layer including silicon germanium (SiGe) is epitaxially grown on a semiconductor substrate 102. In accordance with an embodiment of the present invention, the substrate 102 comprises a semiconductor material including, but not necessarily limited to, silicon (Si), silicon carbide (SiC), Si:C (carbon doped silicon), a II-V or III-V compound semiconductor or other like semiconductor. In addition, multiple layers of the semiconductor materials can be used as the semiconductor material of the substrate 102. In accordance with an embodiment of the present invention, the semiconductor layer has a concentration of germanium of about 25%. However, the embodiments of the resent invention are not limited thereto, and the semiconductor layer may include other concentrations of germanium, such as, for example, about 10% to about 60% germanium.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 550° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Referring to FIG. 1, the SiGe semiconductor on the substrate 102 is patterned into a plurality of fins 110, which are each under a hardmask layer 120. For ease of explanation, two fins 110 are shown in FIG. 1. However, the embodiments of the present invention are not necessarily limited thereto, and the SiGe semiconductor layer can be patterned into more or less than two fins.

According to an embodiment, the hardmasks 120 including, for example, a dielectric material, such as silicon nitride (SiN) are formed on the portions of the SiGe semiconductor layer that is to be formed into the fins 110. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hardmasks 120 to form the fins by RIE processes.

As shown in FIG. 1, a silicon germanium oxide film (SiGeO$_x$) 125 is deposited on the fins 110 and the hardmask layers 120, and on the exposed portions of the substrate 102 using, for example, atomic layer deposition (ALD) or other conformal deposition process. In a non-limiting embodiment, a thickness of the SiGeO$_x$ layer 125 can be in the range of about 2 nm to about 6 nm. SiGeO$_x$ is a mixture of silicon oxide (SiO$_x$) and germanium oxide (GeO$_x$), where x is, for example, 2 in the case of silicon dioxide (SiO$_2$) and germanium dioxide (GeO$_2$) or another value, such as, for example, (1.99 or 2.01).

After deposition of the SiGeO$_x$ layer 125, a cap layer 130 including, for example, amorphous silicon (a-Si) or amorphous silicon germanium (a-SiGe) is deposited on the SiGeO$_x$ layer 125 using, for example, a deposition technique such as, but not necessarily limited to, chemical vapor deposition (CVD), plasma enhanced CVD (PECVD), radio-frequency CVD (RFCVD), physical vapor deposition (PVD), ALD, molecular layer deposition (MLD), molecular beam deposition (MBD), pulsed laser deposition (PLD), liquid source misted chemical deposition (LSMCD), sputtering, and/or plating. The cap layer 130, which includes an oxygen blocking material, prevents external oxygen from reaching SiGeO$_x$ layer 125 during a subsequent thermal annealing process described in connection with FIG. 2.

Figure 2:
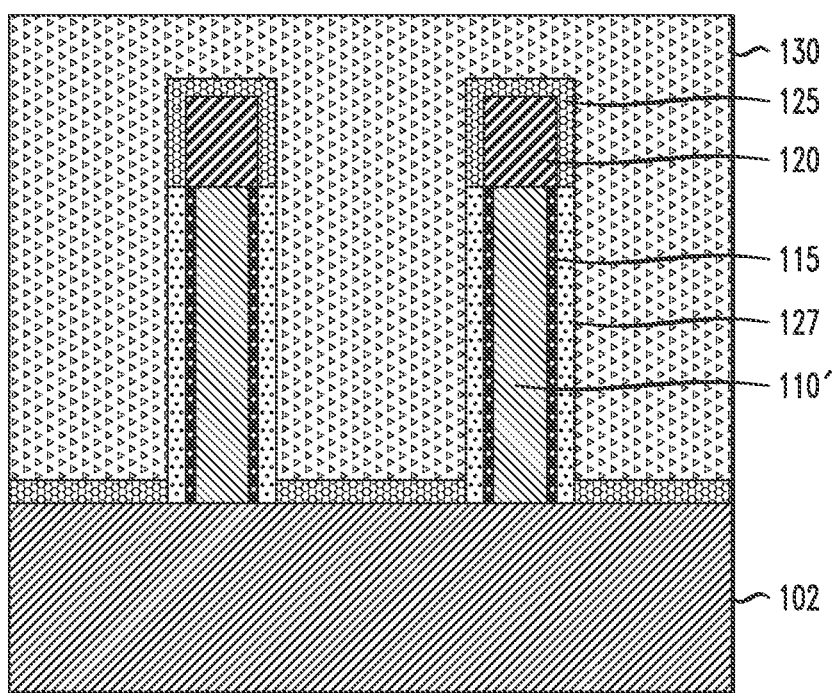
FIG. 2 is a cross-sectional view illustrating silicon-rich (Si-rich) surface formation in a method of manufacturing a semiconductor device, according to an exemplary embodiment of the present invention.

FIG. 2 is a cross-sectional view illustrating silicon-rich (Si-rich) surface formation in a method of manufacturing a semiconductor device, according to an exemplary embodiment of the present invention. Referring to FIG. 2, a thermal annealing process is performed in, for example, nitrogen (N$_2$), argon (Ar), helium (He), xenon (Xe), and/or hydrogen (H$_2$). The temperature at which the thermal annealing process is performed is based on the germanium concentration of the fins 110. In accordance with an embodiment of the present invention, the required annealing temperature to convert a SiGeO$_x$ layer (e.g., SiGeO$_x$ layer 125) on SiGe layers 110 to, for example, a silicon oxide layer (e.g., SiO$_2$ layer 127) and silicon-rich (Si-rich) surfaces 115 is inversely proportional to the germanium concentration in the SiGe semiconductor layers 110. In other words, as the concentration of germanium in SiGe decreases, the temperature required to convert the SiGeO$_x$ layer 125 to the silicon oxide 127 layer and Si-rich surfaces 115 increases.

In general, a high temperature spike anneal process (e.g., about 800° C. to about 1100° C.), causes GeO desorption from the deposited SiGeO$_x$ 125, and the silicon in the SiGe fins 110 to react with oxygen atoms in the SiGeO$_x$ 125 to form $SiO_x$ 127 (e.g., $SiO_2$). The reaction is limited to SiGe portions (e.g., SiGe fins 110) due to a reaction of the deposited $SiGeO_x$ with the SiGe during the high temperature spike anneal process (e.g., 1077° C. for SiGe 40%). As a further result of the high temperature spike annealing, Si-rich surface regions 115 are formed between the $SiO_x$ 127 and remaining SiGe core (e.g., inner) regions 110' (also referred to herein as SiGe channels 110'). According to an embodiment of the present invention, a Si-rich surface region has about 50% less Ge concentration after the chemical reaction than the initial Ge concentration in the SiGe layer. In a non-limiting illustrative example, the starting SiGe layer may be SiGe 40% (40% Ge), and the Si-rich surface is SiGe 20% or less than SiGe 20% (20% Ge).

The chemical reaction of $SiGeO_x$ 125 with SiGe portions 110 causes the formation and desorption of 2GeO (Ge+$GeO_2$->2GeO), and the formation of $SiO_x$ 127 and a Si-rich outer surface 115 on the SiGe core portions 110' during spike annealing. The chemical reaction of $SiGeO_x$ 125 with SiGe portions 110 (also referred to as a germanium pull-out process) is self-limiting, such that selective Ge atom removal continues until the $GeO_2$ is consumed or the number of Si atoms on the top surface of the SiGe portion 110 is enough to block further chemical reaction of $GeO_2$ with germanium from the SiGe portion 110. Thus, the germanium pull-out process can be a self-limited process controlled by a thickness of a deposited $SiGeO_x$ layer. The $SiGeO_x$ 125 does not react with Si surfaces lacking germanium, such as, for example, the hardmasks 120 and the surface of the substrate 102. As a result, the top surface of the substrate 102 and the hardmasks 120 remain intact.

Figure 3:
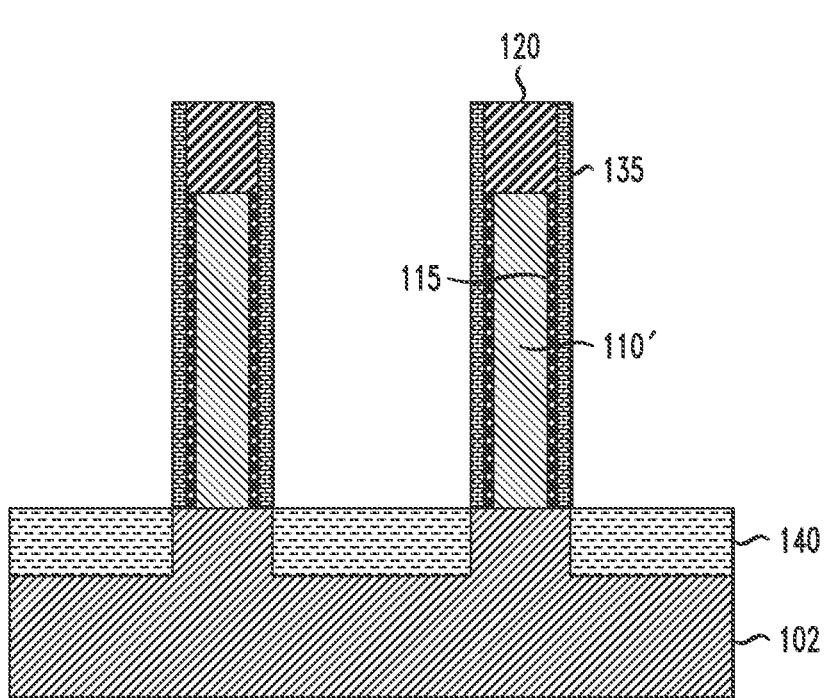
FIG. 3 is a cross-sectional view illustrating removal of $SiGeO_x$, $SiO_x$ and cap layers, and formation of a liner layer and bottom source/drain regions in a method of manufacturing a semiconductor device, according to an exemplary embodiment of the present invention.

FIG. 3 is a cross-sectional view illustrating removal of $SiGeO_x$, $SiO_x$ and cap layers, and formation of a liner layer and bottom source/drain regions in a method of manufacturing a semiconductor device, according to an exemplary embodiment of the present invention. Referring to FIG. 3, the cap layer 130 is removed using, for example, a wet etch chemistry of, for example, hot ammonium hydroxide ($NH_4OH$), KOH, or TMAH, or a dry etch chemistry including, for example, a selective RIE with fluorine gas, and the unreacted portions of the $SiGeO_x$ layer 125 and $SiO_x$ layer 127 are removed using, for example, a wet or dry etch process including, for example, diluted HF solution.

Following removal of the $SiGeO_x$, $SiO_x$ and cap layers 125, 127 and 130, a liner layer is conformally deposited on the substrate 102, and on the SiGe core portions 110' including the Si-rich portions 115 and the hardmasks 120 thereon using, for example, ALD or other conformal deposition technique. Following conformal deposition, a directional removal process, such as, for example, reactive ion etching (RIE), is performed to remove horizontal portions of the deposited liner layer to result in the liner layer 135 on vertical portions of the Si-rich and hardmask portions 115 and 120. According to an embodiment of the present invention, the liner layer 135 includes a nitride, such as, for example, silicon boron nitride (SiBN), siliconborocarbonitride (SiBCN), silicon oxycarbonitride (SiOCN), or SiN.

With the Si-rich portions 115 covered by the hardmasks 120 and liner layer 135, portions of the substrate 102 between the remaining SiGe core portions 110' are recessed to for example, a depth of about 20 nm to about 60 nm. Recessing of the substrate 102 is performed using, for example, directional RIE with fluorine or chlorine-based gases or wet etching with a hydrofluoric acid etchant. Then, bottom source/drain regions 140 are epitaxially grown in a bottom-up epitaxial growth process from the recessed portions of the substrate 102 in trenches formed by the recessing. The epitaxially grown bottom source/drain regions 140 comprise, for example, SiGe (e.g., SiGe 53%) and can be doped using processes, such as, for example, ion implantation, in situ, gas phase doping, plasma doping, plasma immersion ion implantation, cluster doping, infusion doping, liquid phase doping, solid phase doping, etc., and dopants may include, for example, a p-type dopant selected from a group of boron (B), gallium (Ga), indium (In), and thallium (Tl) at various concentrations. For example, in a non-limiting example, a dopant concentration range may be $1e18/cm^3$ to $1e21/cm^3$.

Figure 4:
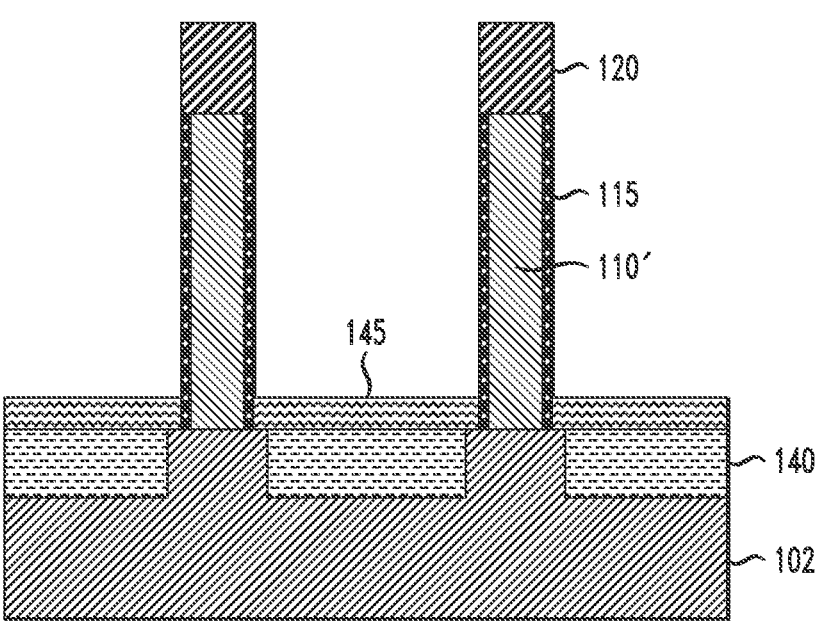
FIG. 4 is a cross-sectional view illustrating bottom spacer formation in a method of manufacturing a semiconductor device, according to an exemplary embodiment of the present invention.

FIG. 4 is a cross-sectional view illustrating bottom spacer formation in a method of manufacturing a semiconductor device, according to an exemplary embodiment of the present invention. Referring to FIG. 4, the liner layer 135 is removed using, for example, a wet etch process using diluted HCl solution. A bottom spacer layer 145 is formed on exposed horizontal surfaces including the bottom source/drain region 140. Spacer material includes, but is not necessarily limited to, plasma enhanced chemical vapor deposition (PECVD)-type, high aspect ratio process (HARP)-type or high density plasma (HDP)-type low-K dielectric layers, including, but not necessarily limited to, silicon boron nitride (SiBN), siliconborocarbonitride (SiBCN), silicon oxycarbonitride (SiOCN), SiN or $SiO_2$. The bottom spacer layer 145 is deposited using, for example, directional deposition techniques, including, but not necessarily limited to, high density plasma (HDP) deposition, PVD, and gas cluster ion beam (GCIB) deposition. The directional deposition deposits the spacer material preferably on the exposed horizontal surfaces, but not on lateral sidewalls. Spacer material formed on the hardmasks 120 (not shown) can be removed using a planarization step, such as, for example, chemical mechanical polishing (CMP).

Figure 5:
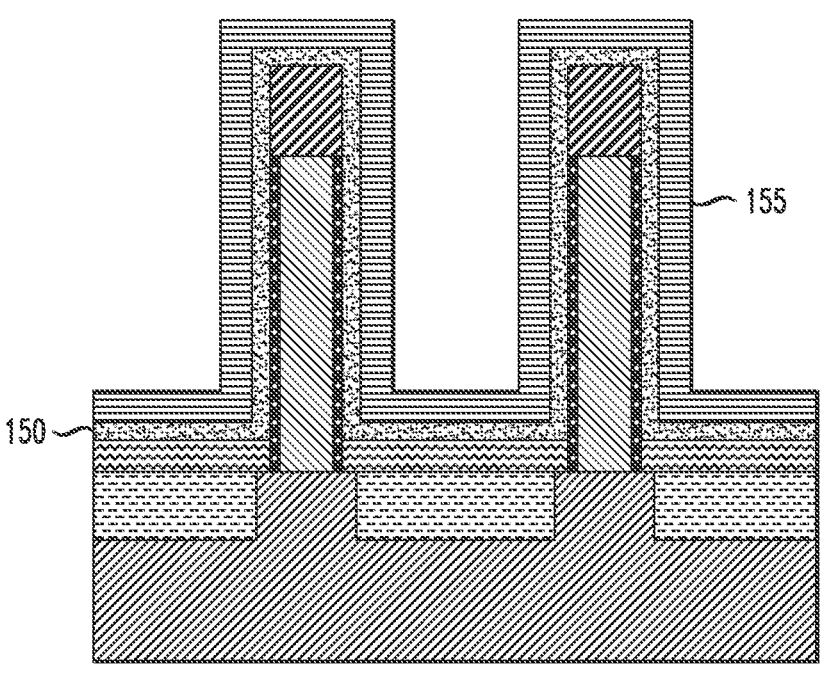
FIG. 5 is a cross-sectional view illustrating gate stack formation in a method of manufacturing a semiconductor device, according to an exemplary embodiment of the present invention.

FIG. 5 is a cross-sectional view illustrating gate stack formation in a method of manufacturing a semiconductor device, according to an exemplary embodiment of the present invention. Referring to FIG. 5, the gate stack includes gate layers 155 and dielectric layers 150. The dielectric layers 150 include, for example, a high-K material including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The gate layers 155 include, for example, a work-function metal (WFM) layer, including but not necessarily limited to, titanium nitride (TiN), tantalum nitride (TaN) or ruthenium (Ru). The gate layers 155 further include a gate metal layer including, but not limited to tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate structures are conformally deposited on the spacers 145 and on the SiGe channels 110' including the Si-rich surfaces 115 thereon, using, for example, deposition techniques including, but not limited to, CVD, PECVD, RFCVD, PVD, ALD, MLD, MBD, PLD, LSMCD, sputtering, and/or plating. Prior to formation of the gate structure, a pre-clean process using, for example, diluted HCl and HF surface cleaning, followed by a thin interfacial layer formation (e.g., $SiO_2$ ranging 5 angstroms to 10 angstroms), is performed.

Figure 6:
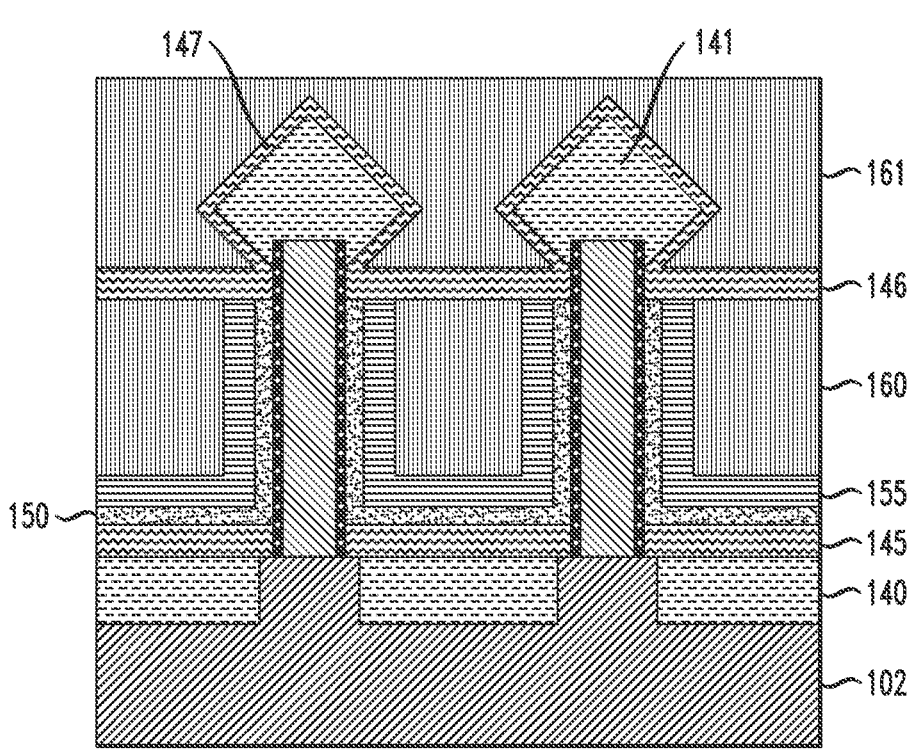
FIG. 6 is a cross-sectional view illustrating top source/drain, top source/drain liner and inter-layer dielectric (ILD) layer formation in a method of manufacturing a semiconductor device, according to an exemplary embodiment of the present invention.

FIG. 6 is a cross-sectional view illustrating top source/drain, top source/drain liner and inter-layer dielectric (ILD) layer formation in a method of manufacturing a semiconductor device, according to an exemplary embodiment of the present invention. Referring to FIG. 6, an ILD layer 160 is formed on the gate structures including the gate and dielectric layers 155 and 150. The ILD layer 160 includes, for example, $SiO_2$, silicon oxycarbide (SiOC), SiOCN or some other dielectric, and is deposited using a deposition process, such as, for example, CVD, PECVD, PVD, ALD, MBD, PLD, LSMCD, and/or spin-on coating. A planarization process, such as, for example, CMP, is performed to remove excess portions of the gate structures, ILD layer 160 and spacer material on the hardmasks 120.

The ILD layer 160 and the gate structures including the gate layers 155 and the dielectric layers 150 are recessed using, for example, an anisotropic etch process, such as RIE, ion beam etching, plasma etching or laser ablation. As can be seen, the ILD layer 160 and the gate structures are recessed to a height above the substrate 102 below the top surface of the SiGe channel 110'. According to an embodiment, recessing is performed by diluted SC (Standard Cleaning 1) or hydrogen peroxide for recessing the gate layers 155, and a diluted HF/HCl solution for recessing the dielectric layers 150.

A top spacer layer 146 is formed on exposed horizontal surfaces including the ILD layer 160 and upper surfaces of the gate structures including the gate layers 155 and the dielectric layers 150. Top spacer material is the same or similar to the bottom spacer material and is deposited using the same or similar deposition techniques as that of the bottom spacers 145. The hardmasks 120 and the spacer material formed on the hardmasks 120 are removed using a selective RIE to expose upper portions of the SiGe channels 110' and Si-rich portions 115.

Top source/drain regions 141 are epitaxially grown from the exposed portions of the SiGe channels 110' and Si-rich portions 115. In accordance with an embodiment of the present invention, B, Ga, In, and Tl doped top source/drain regions 141 including, for example, SiGe, (e.g., B-doped SiGe 53%) are epitaxially grown. Doping can be at concentrations in the general range of e19 to $e21/cm^3$.

Top source/drain liner layers 147 are deposited on the top source/drain regions 147 using a conformal deposition technique, such as ALD or other conformal deposition technique, Top source/drain liner layer material is the same or similar to the top spacer material.

Following formation of the top source/drain liner layers 147, another ILD layer 161 is formed on the top spacer layer 146 and on and around the top source/drain regions 141 including the top source/drain liner layers 147 thereon. The ILD layer 161 includes the same or similar material and is deposited using the same or similar deposition techniques as the ILD layer 160.

Figure 7:
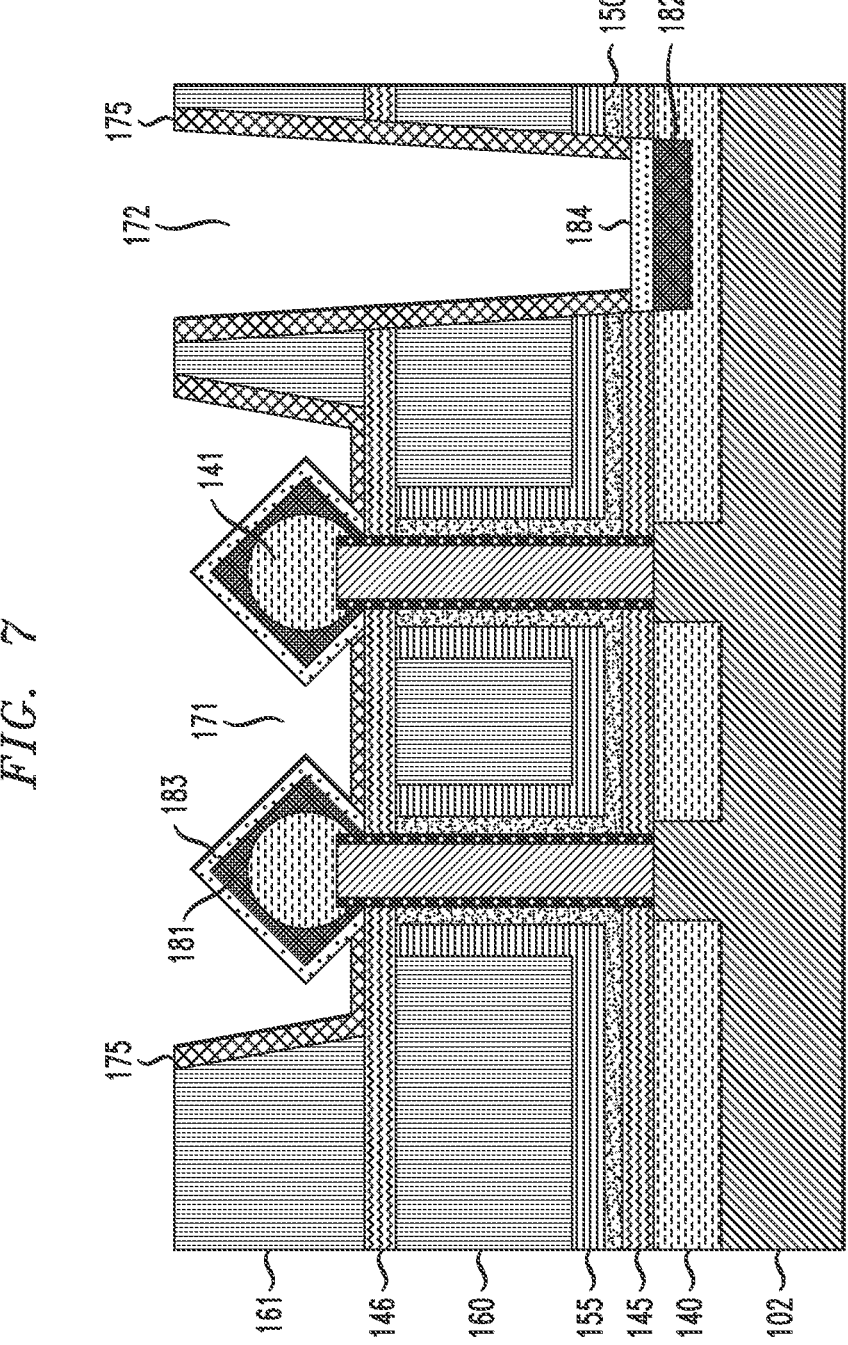
FIG. 7 is a cross-sectional view illustrating top and bottom source/drain contact trench formation, and germanium oxide ($GeO_2$) deposition for selective germanium condensation in a method of manufacturing a semiconductor device, according to an exemplary embodiment of the present invention.

FIG. 7 is a cross-sectional view illustrating top and bottom source/drain contact trench formation, and germanium oxide ($GeO_2$) deposition for selective germanium condensation in a method of manufacturing a semiconductor device, according to an exemplary embodiment of the present invention. Referring to FIG. 7, contact trenches 171 and 172 are opened in the ILD layers 161 and/or 160 over the top and bottom source/drain regions 141 and 140 using, for example, lithography followed by RIE. According to an embodiment, the etchant is selective with respect to the liner layer 147. The liner layer 147 functions as an etch stop layer during the opening of the contact trenches 171 and 172. Following formation of the trenches 171 and 172, another etch process using, for example, chlorine-based etch gas (e.g., $Cl_2$) or fluorine-based etch gas (e.g., $CF_4$, $CHF_3$, $SF_6$), is performed to remove the top source/drain liner layer 147.

Then, a germanium oxide ($GeO_2$) layer 175 is deposited using ALD or other conformal deposition process to line side and bottom surfaces of the trenches 171 and 172, and on exposed surfaces of the top source/drain region where the liner layer 147 was removed in the trench 171, and on an exposed top surface of the bottom source/drain region 140 in the trench 172. A thermal annealing process is performed to convert the portions of the $GeO_2$ layer 175 on the exposed surfaces of the SiGe bottom and top source/drain regions 140 and 141 to silicon oxide (e.g., $SiO_2$) layers 183 and 184, with Ge condensed surfaces 181 and 182 respectively under the silicon oxide layers 183 and 184. The thermal annealing is performed at a temperature of, for example, below about 500° C. in, for example, a $N_2$, Ar, Xe, He, and/or $H_2$ ambient (not an oxygen ambient), so that the germanium concentration in the Ge condensed surfaces 181 and 182 increases by up to 20%. For purposes of illustration, the top and bottom source/drain regions 141 and 140 comprise SiGe with about 50% germanium (e.g., SiGe 53%). The thermal annealing process converts portions of the $GeO_2$ layer 175 on the top and bottom source/drain regions 141 and 140 into the layers 183 and 184, respectively. The layers 183 and 184 comprise $SiO_x$, where x is, for example, 2 in the case of silicon dioxide ($SiO_2$), or 1.99 or 2.01.

The annealing conditions cause the Si in the SiGe source/drain regions 141 and 140 to bond with the oxygen in the $GeO_2$ layers 175 to form $SiO_x$ layers 183 and 184. The Si in the SiGe source/drain regions 141 and 140 does not bond with the Ge in the $GeO_2$ layers 175. As a result, the Ge from the $GeO_2$ layers 175 is driven into the Ge condensed surfaces 181 and 182, respectively, and the Si from those portions is driven out of the regions 181 and 182 to bond with the oxygen, which forms higher Ge % portions 181 and 182. The resulting Ge concentration in the portions 181 and 182 after thermal annealing is higher than the Ge concentration in source/drain regions 141 and 140 prior to the thermal annealing.

Figure 8:
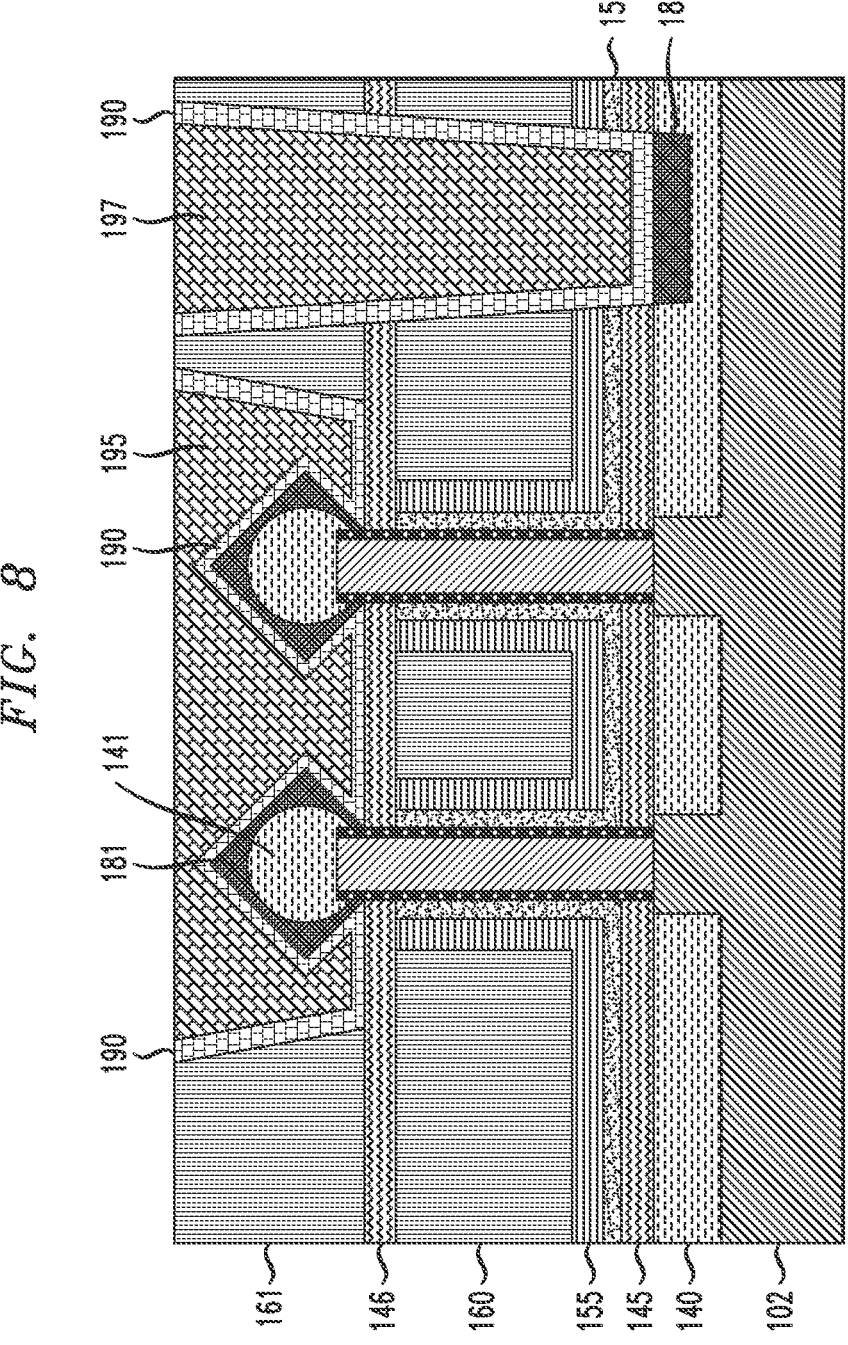
FIG. 8 is a cross-sectional view illustrating metal contact formation in a method of manufacturing a semiconductor device, according to an exemplary embodiment of the present invention.

FIG. 8 is a cross-sectional view illustrating metal contact formation in a method of manufacturing a semiconductor device, according to an exemplary embodiment of the present invention. Referring to FIG. 8, the $SiO_x$ layers 183 and 184 and the unreacted portions of the $GeO_2$ layer 175 are removed. The unreacted portions of the $GeO_2$ layer 175 are water soluble, and are removed using, for example, a water based agent, such as, for example, deionized (DI) water. The removal of the $SiO_x$ layers 183 and 184 is performed using a wet or dry etch process including, for example, diluted HF solution.

Contacts 195 and 197 to top and bottom source/drain regions 141 and 140 are respectively formed in the trenches 171 and 172 by filling the trenches 171 and 172 with contact layers 195 and 197 including, for example, electrically conductive material such as, but not necessarily limited to, tungsten, cobalt, zirconium, tantalum, titanium, aluminum, ruthenium, and/or copper. Liner layers 190 including, for example, a metal silicide, are formed on side and bottom surfaces of the trenches 171 and 172 on Ge condensed surfaces 181 and 182 of the source/drain regions 141 and 140. The structure including a single contact region 195 in one trench 171 to multiple source/drain regions 141, as opposed to multiple contacts in respective trenches to corresponding source/drain regions, increases the area and volume of the contact region, resulting in a lower resistance on the contact region than when a plurality of contacts are used. In addition, the relatively higher Ge content surfaces 181 and 182 reduce contact resistivity. In accordance with an embodiment of the present invention, downstream processes are below 450° C., and do not modify the Ge concentration in the top and bottom source/drain layers 141 and 140, or in the Ge condensed surfaces 181 and 182.

Figure 9:
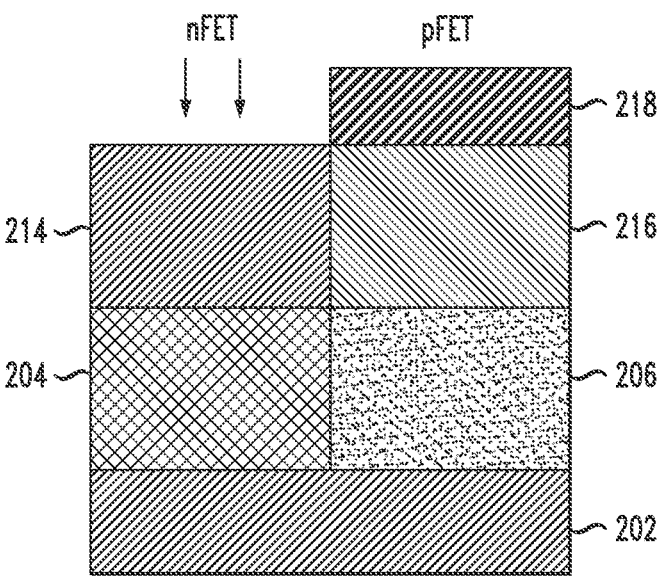
FIG. 9 is a cross-sectional view illustrating punch-through stop (PTS) layer formation in a method of manufacturing a semiconductor device, according to an exemplary embodiment of the present invention.

FIG. 9 is a cross-sectional view illustrating punch-through stop (PTS) layer formation in a method of manufacturing a semiconductor device, according to an exemplary embodiment of the present invention. Referring to FIG. 9, in one embodiment, a semiconductor substrate 202 includes semiconductor material including, but not necessarily limited to, silicon (Si), silicon germanium (SiGe), silicon carbide (SiC), Si:C (carbon doped silicon), silicon germanium carbide (SiGe:C), carbon doped silicon germanium (SiGe:C), III-V, II-V compound semiconductor or other like semiconductor. In addition, multiple layers of the semiconductor materials can be used as the semiconductor material of the substrate. The semiconductor substrate 202 can be a bulk substrate or a silicon-on-insulator (SOI) substrate including a buried insulating layer, such as, for example, a buried oxide or nitride layer.

Formed on substrate 202 are semiconductor layers 214 and 216 including, for example, silicon and silicon germanium, respectively, which can be epitaxially grown. Lower portions of the silicon and silicon germanium layers 214 and 216 are doped in a punch-through stop (PTS) process to form PTS layers 204 and 206 (p-well and n-well, respectively). In a non-limiting illustrative example, the PTS layer 204 is doped with, for example, boron (B), and the PTS layer 206 is doped with, for example, arsenic (As) or phosphorous (P), at concentrations in the general range of $5e18/cm^3$ to $5e19/cm^3$. A thickness of the PTS layers 204 and 206 can be approximately 5 nm to approximately 100 nm. According to an embodiment, a mask 218 about 10 nm to about 100 nm thick, blocks either an nFET side or pFET side while the unblocked side is doped (as shown by arrows). In accordance with an embodiment, if it is required to have undoped Si/SiGe active channels, PTS layers can be grown by epitaxy and active channels epitaxially grown on PTS layers separately.

Figure 10:
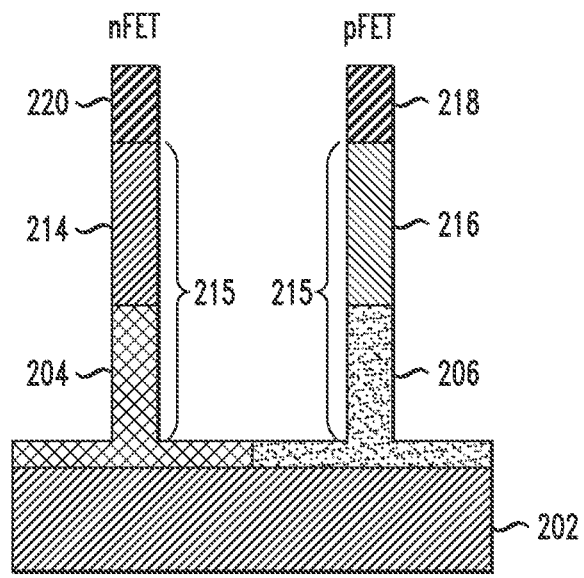
FIG. 10 is a cross-sectional view illustrating fin formation in a method of manufacturing a semiconductor device, according to an exemplary embodiment of the present invention.

FIG. 10 is a cross-sectional view taken perpendicular to a fin extension direction and illustrating fin formation in a method of manufacturing a semiconductor device, according to an exemplary embodiment of the present invention. Referring to FIG. 10, the Si and SiGe layers 214 and 216, and upper portions of the underlying PTS layers 204 and 206 are patterned into a plurality of fins 215, which are each under a hardmask layer 220. The fin 215 in an nFET region includes the patterned Si layer 214 and the patterned portion of the PTS layer 204, and the fin 215 in the pFET region includes the patterned SiGe layer 216 and the patterned portion of the PTS layer 206. For ease of explanation, two fins 215 are shown in FIG. 1. However, the embodiments of the present invention are not necessarily limited thereto, and there may be more than two fins. According to an embodiment, lower portions of the PTS layers 204 and 206 are not patterned into the fins 215.

According to an embodiment, the hardmasks 220 including, for example, a dielectric material, such as silicon nitride (SiN) are formed on the portions of the Si and SiGe semiconductor layers that are to be formed into the fins 215. The fin patterning can be done by various patterning techniques, including, but not necessarily limited to, directional etching and/or a SIT process, for example.

Figure 11B:
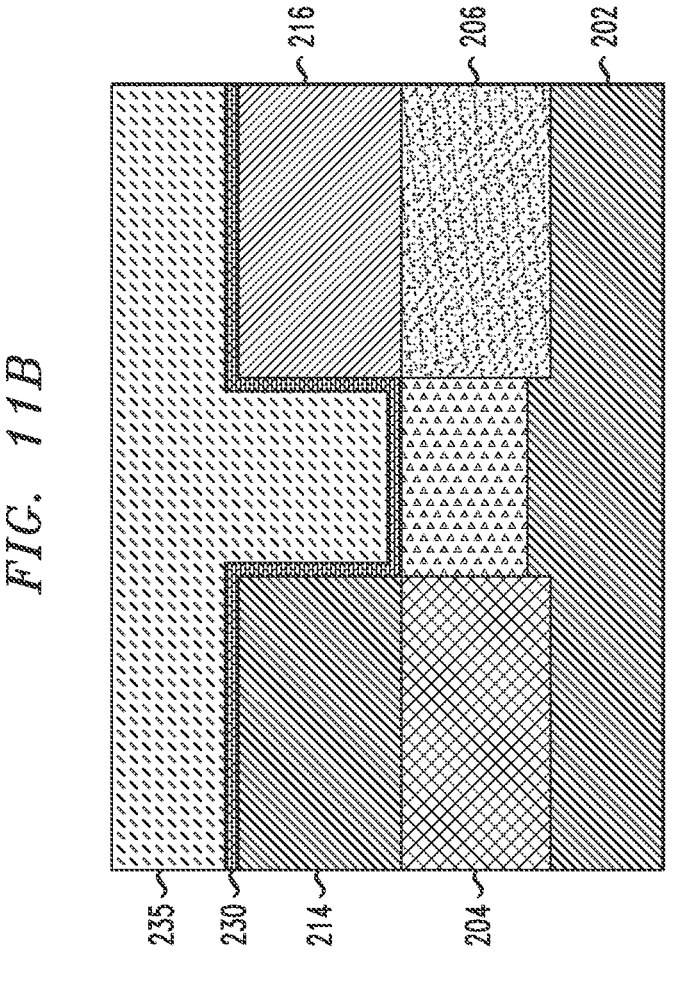
FIG. 11B is a cross-sectional view taken parallel to a fin extension direction and illustrating isolation region formation and dummy gate deposition in a method of manufacturing a semiconductor device, according to an exemplary embodiment of the present invention.
Figure 11A:
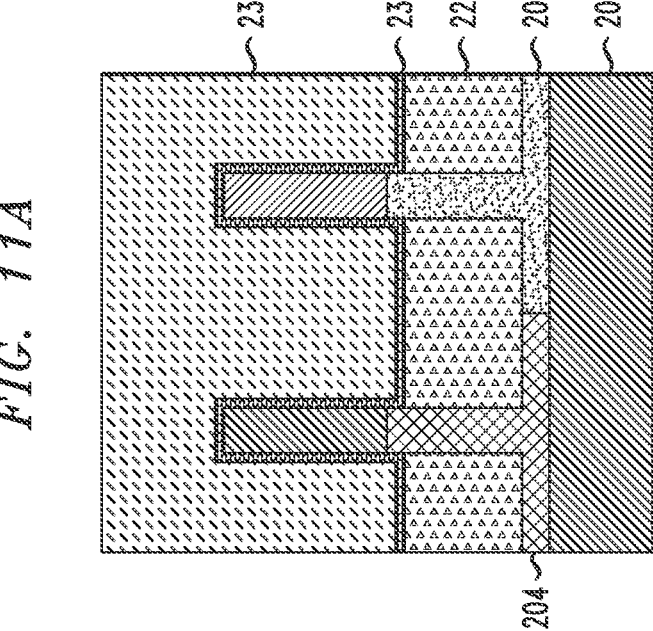
FIG. 11A is a cross-sectional view taken perpendicular to a fin extension direction and illustrating isolation region formation and dummy gate deposition in a method of manufacturing a semiconductor device, according to an exemplary embodiment of the present invention.

FIGS. 11A and 11B are cross-sectional views taken perpendicular and parallel to a fin extension direction, respectively, and illustrating isolation region formation and dummy gate deposition in a method of manufacturing a semiconductor device, according to an exemplary embodiment of the present invention. Referring to FIGS. 11A and 11B, an isolation material, such as, for example, a dielectric material, including, but not limited to $SiO_2$, low-temperature oxide (LTO), high-temperature oxide (HTO), field oxide (FOX) or some other dielectric, is deposited on the structure from FIG. 10 and recessed to form isolation region 225, such as, for example, shallow trench isolation (STI) region. The isolation region 225 is positioned on the substrate 202 on sides of the fins 215 and on unpatterned portions of the PTS layers 204 and 206. The isolation material can be deposited using deposition techniques including, but not limited to, CVD, PECVD, RFCVD, PVD, ALD, MBD, PLD, and/or LSMCD, sputtering, and/or plating, followed by a planarization process, such as CMP to remove excess isolation material. Following planarization, the hardmasks 220 are removed, and the isolation material is recessed to form isolation region 225 at a height level with or substantially level with upper surfaces of the patterned portions of the PTS layers 204 and 206 (i.e., where the patterned portions of the PTS layers 204 and 206 interface with the patterned Si and SiGe layers 214 and 216). Recessing can be performed using for example, wet etching with HF solution, or buffered hydrofluoric acid (BHF) solution, or an ammonia ($NH_3$)/HF based dry etching process.

A dummy (sacrificial) gate structure including a dummy dielectric 230 and a dummy gate 235 is formed on the isolation region 225 and around the fins patterned Si and SiGe layers 214 and 216. The dummy gate 235 can include a material that can be selectively etched with respect to adjacent layers. For example, the dummy gate 235 may include a-Si, a-SiGe or amorphous carbon (a-C). Dummy dielectric layer 230 includes, for example, $SiO_2$, LTO, HTO, or FOX. The dummy gate and dielectric 235 and 230 can be deposited using deposition techniques including, but not limited to, CVD, PECVD, RFCVD, PVD, ALD, MBD, PLD, and/or LSMCD, sputtering, and/or plating.

Figure 12:
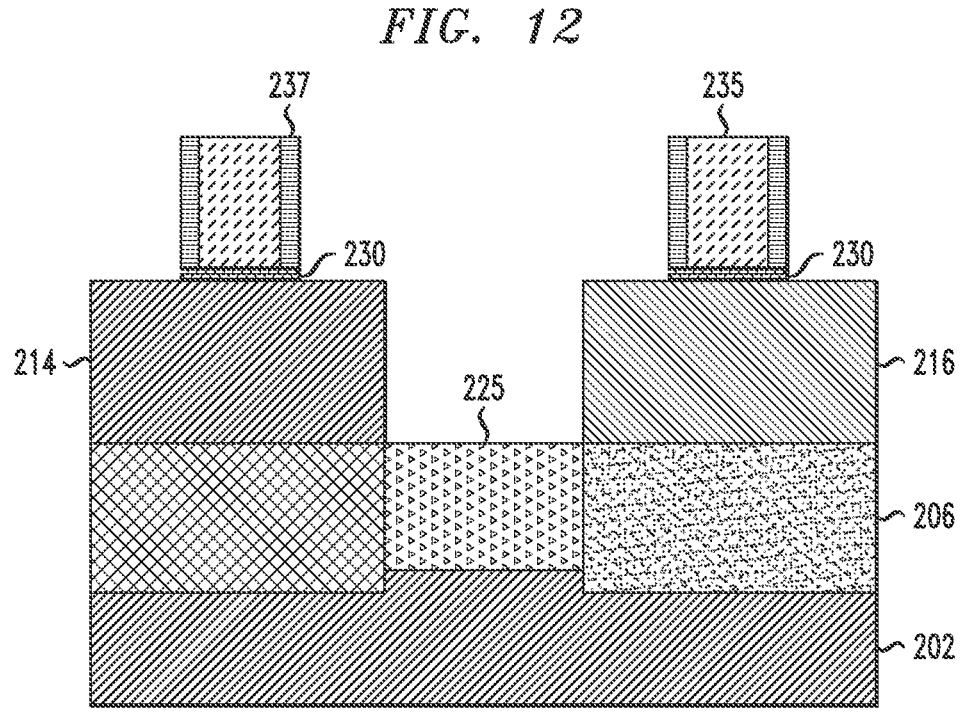
FIG. 12 is a cross-sectional view illustrating dummy gate patterning in a method of manufacturing a semiconductor device, according to an exemplary embodiment of the present invention.

FIG. 12 is a cross-sectional view taken parallel to a fin extension direction and illustrating dummy gate patterning in a method of manufacturing a semiconductor device, according to an exemplary embodiment of the present invention. Referring to FIG. 12, portions of the dummy gate 235 are covered using, for example, a mask (not shown), and exposed portions are removed using, for example, a fluorine-based dry etching process (e.g., RIE) to result in the patterned dummy gate portions 235 on underlying dummy dielectric layers 230 and the Si and SiGe layers 214 and 216. Following dummy gate patterning, spacer layers 237 are formed by conformally depositing a spacer material, such as, for example, SiN, SiBCN or SiOCN on the remaining portions of the dummy gate and dummy dielectric layers 235 and 230 using, for example, ALD or other conformal deposition technique. Then, a directional etching process, such as, for example, RIE is performed to remove portions of the deposited spacer material and underlying dummy dielectric 230 to result in the spacer layers 237 on side surfaces of the patterned dummy gate portions 235.

Figure 13:
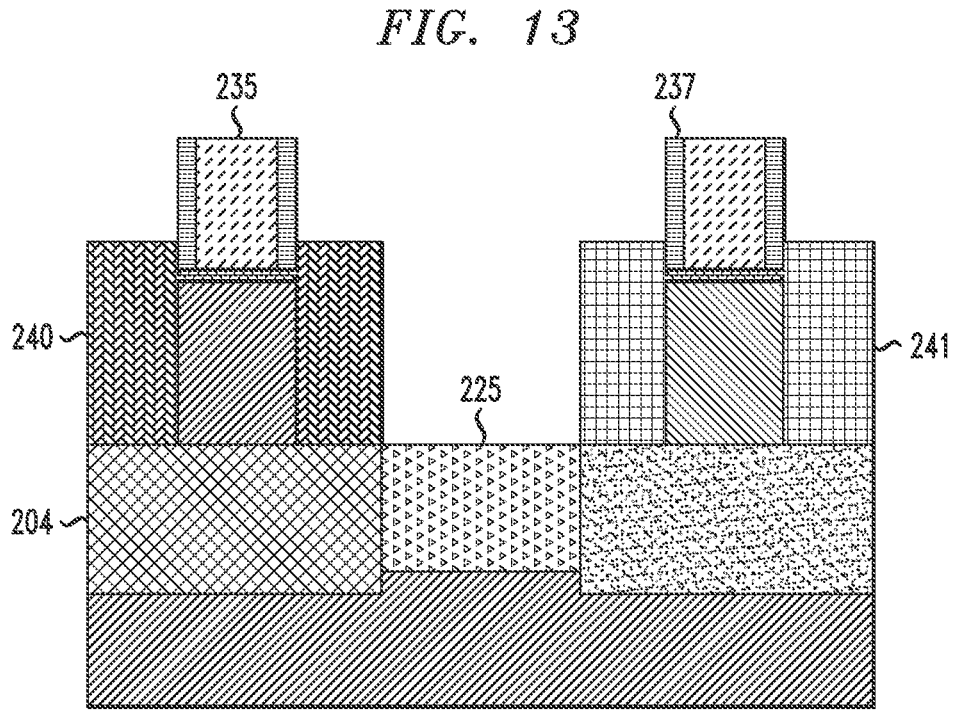
FIG. 13 is a cross-sectional view illustrating source/drain region formation in a method of manufacturing a semiconductor device, according to an exemplary embodiment of the present invention.

FIG. 13 is a cross-sectional view taken parallel to a fin extension direction and illustrating source/drain region formation in a method of manufacturing a semiconductor device, according to an exemplary embodiment of the present invention. Referring to FIG. 13, a width of Si and SiGe portions 214 and 216 on the patterned portions of the PTS layers 204 and 206 is reduced by removing parts of the Si and SiGe portions 214 and 216 not covered by the dummy gates 235 and the spacers 237. Following the width reduction, source/drain regions 240 and 241 are epitaxially grown from the Si and SiGe portions 214 and 216. For example, the source/drain regions 240 include phosphorous or arsenic doped silicon (Si:P or Si:As), and the source/drain regions 241 include boron doped silicon germanium (SiGe:B).

Figure 14:
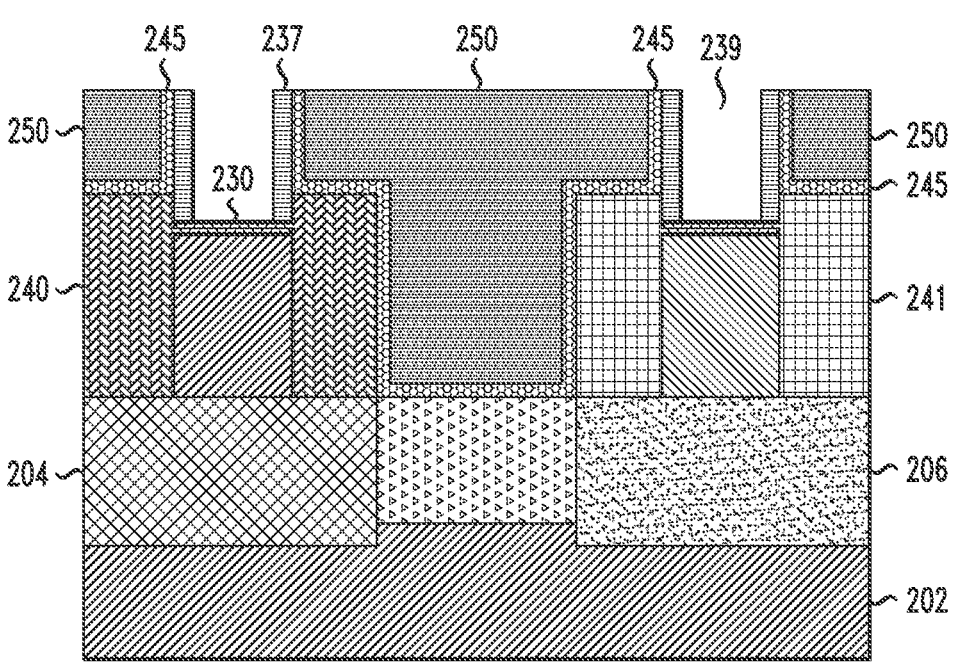
FIG. 14 is a cross-sectional view illustrating source/drain liner and dielectric layer deposition and dummy gate removal in a method of manufacturing a semiconductor device, according to an exemplary embodiment of the present invention.

FIG. 14 is a cross-sectional view taken parallel to a fin extension direction and illustrating source/drain liner and dielectric layer deposition and dummy gate removal in a method of manufacturing a semiconductor device, according to an exemplary embodiment of the present invention. Referring to FIG. 14, a source/drain liner layer 245 is conformally deposited on the structure from FIG. 13 using, for example, ALD or other conformal deposition technique. The source/drain liner layer 245 includes, for example, SiN, SiBCN or SiOCN. Following deposition of the source/drain liner layer 245, a dielectric fill layer 250 is deposited on the source/drain liner 245 using deposition techniques including, but not limited to, CVD, PECVD, RFCVD, PVD, ALD, MBD, PLD, and/or LSMCD, followed by planarization by, for example, CMP, to expose the upper surfaces of the dummy gates 235. The dielectric fill layer 250 includes, for example, $SiO_2$, LTO, HTO, or FOX. The exposed dummy gates 235 are then removed to create openings 239. A suitable wet or dry etch process can be used to remove a-Si, a-SiGe, or a-C dummy gates 235. For example, a hot ammonia based solution can be used to remove the dummy gates 235.

Figure 15B:
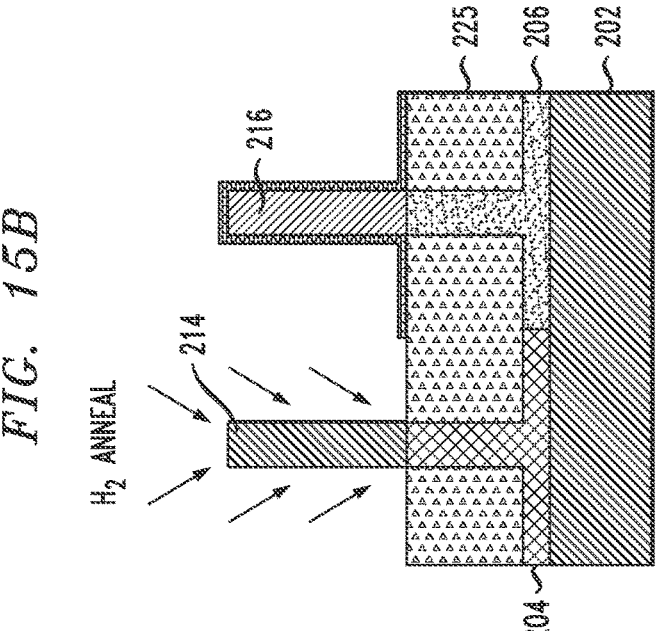
FIG. 15B is a cross-sectional view taken perpendicular to a fin extension direction and illustrating dummy dielectric removal from a silicon channel in a method of manufacturing a semiconductor device, according to an exemplary embodiment of the present invention.
Figure 15A:
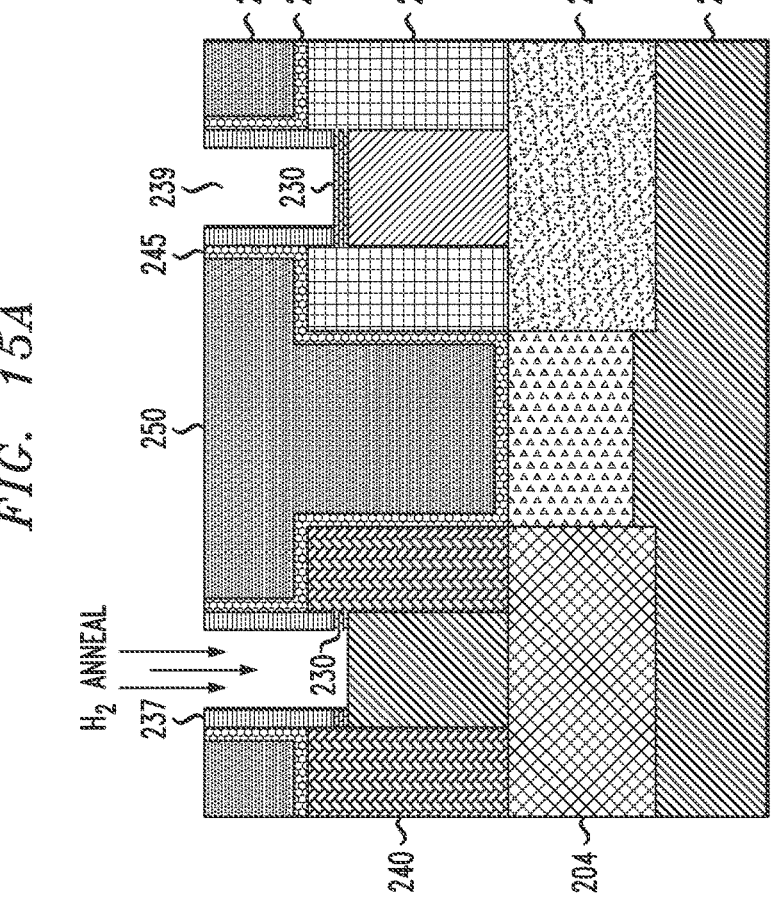
FIG. 15A is a cross-sectional view taken parallel to a fin extension direction and illustrating dummy dielectric removal from a silicon channel in a method of manufacturing a semiconductor device, according to an exemplary embodiment of the present invention.

FIGS. 15A and 15B are cross-sectional views taken parallel and perpendicular to a fin extension direction, respectively, and illustrating dummy dielectric removal from a silicon channel in a method of manufacturing a semiconductor device, according to an exemplary embodiment of the present invention. Referring to FIGS. 15A and 15B, the dummy dielectric 230 is removed from the Si portion 214 (e.g., Si channel) of the fin 215 and adjacent portions of the isolation region 225 using, for example, buffered HF (BHF) or DHF, to expose the Si portion 214 and the adjacent isolation region 225. The dummy dielectric 230 remains on the SiGe portion 216 (e.g., SiGe channel) of the other fin 215 and the portions of the isolation region 225 adjacent the SiGe portion 216.

As shown by the arrows, an $H_2$ annealing process is performed at for example, about 650° C. to about 750° C. for 5 minutes for smoothening of the Si portion 214. The SiGe portion 216, which is still covered by the dummy dielectric layer 230, remains unaffected and is not smoothened by the $H_2$ annealing process.

Figure 16B:
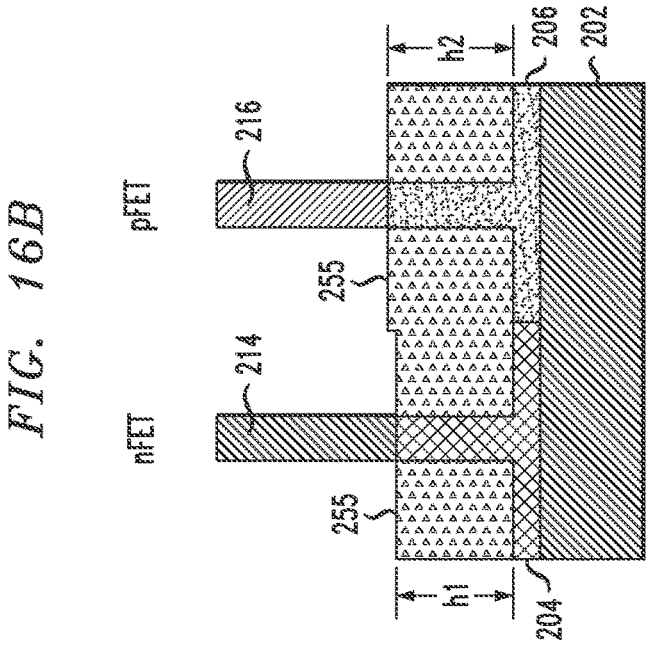
FIG. 16B is a cross-sectional view taken perpendicular to a fin extension direction and illustrating dummy dielectric removal from a silicon germanium channel in a method of manufacturing a semiconductor device, according to an exemplary embodiment of the present invention.
Figure 16A:
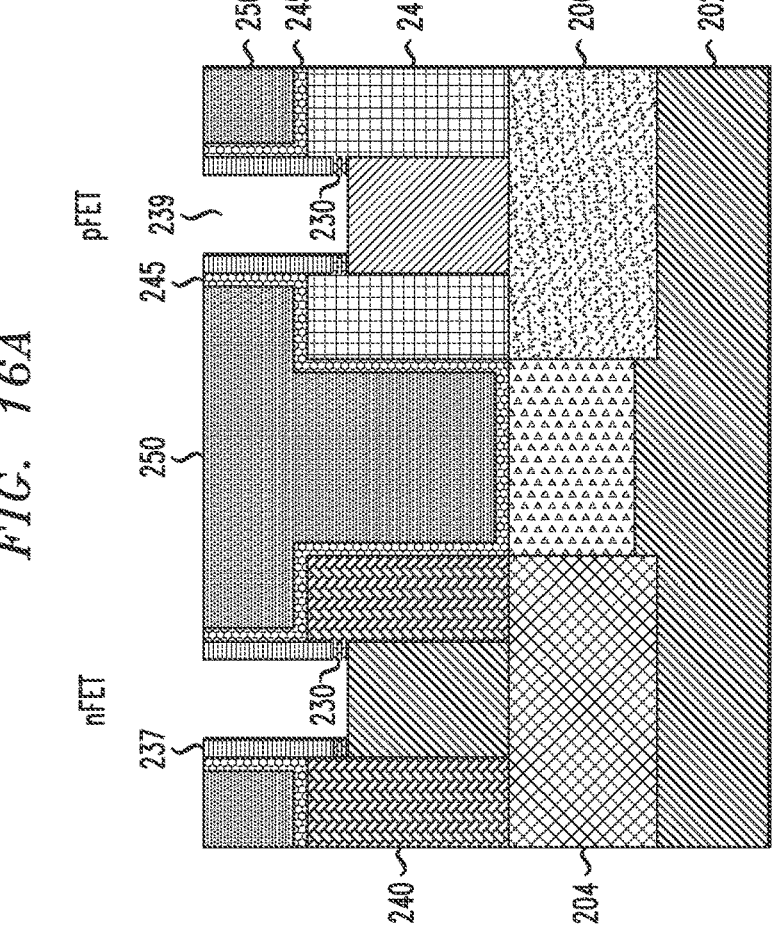
FIG. 16A is a cross-sectional view taken parallel to a fin extension direction and illustrating dummy dielectric removal from a silicon germanium channel in a method of manufacturing a semiconductor device, according to an exemplary embodiment of the present invention.

FIGS. 16A and 16B are cross-sectional views taken parallel and perpendicular to a fin extension direction, respectively, and illustrating dummy dielectric removal from a silicon germanium channel in a method of manufacturing a semiconductor device, according to an exemplary embodiment of the present invention. Referring to FIGS. 16A and 16B, the dummy dielectric 230 is removed from the SiGe portion 216 (e.g., SiGe channel) of the fin 215 and the adjacent portions of the isolation region 225 using, for example, BHIF or DHF, to expose the SiGe portion 216 and the adjacent portions of the isolation region 225. Since the dummy dielectric 230 was already removed from the Si portion 214 (e.g., SiGe channel) of the other fin 215, and the portions of the isolation region 225 adjacent the Si portion 214, isolation region thickness (h1) is less in the nFET region than the isolation region thickness (h2) in the pFET region (e.g., by about 2 nm to about 5 nm) due to twice dummy dielectric budget in the nFET region. In other words, the exposed isolation region 225 on the nFET side is recessed during dummy dielectric removal from the pFET side to cause h1 to be less than h2.

Figure 18B:
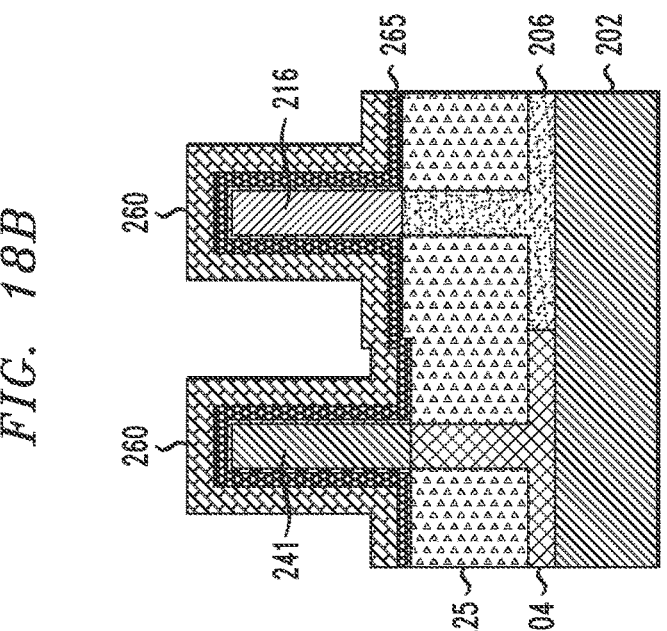
FIG. 18B is a cross-sectional view taken perpendicular to a fin extension direction and illustrating gate structure formation in a method of manufacturing a semiconductor device, according to an exemplary embodiment of the present invention.

In addition, a PTS layer 204 which extends deeper into the gate structure than the PTS layer 206 avoids parasitic channel formation at the bottom of the channel portion. In other words, as can be seen in FIG. 18B, the interface between PTS layer 204 and channel portion 214 is at a greater height with respect to the upper surface of the isolation region 225 and a gate structure on the upper surface of the isolation region 225 than an interface between PTS layer 206 and channel portion 216. The top surface of the isolation region 225 in the nFET region is below a top surface of the punch-through stop layer 204.

Figure 17B:
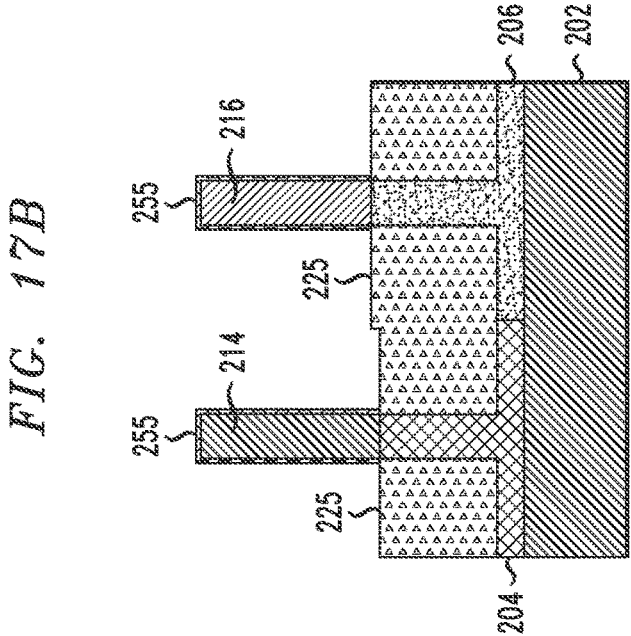
FIG. 17B is a cross-sectional view taken perpendicular to a fin extension direction and illustrating interfacial layer formation in a method of manufacturing a semiconductor device, according to an exemplary embodiment of the present invention.
Figure 17A:
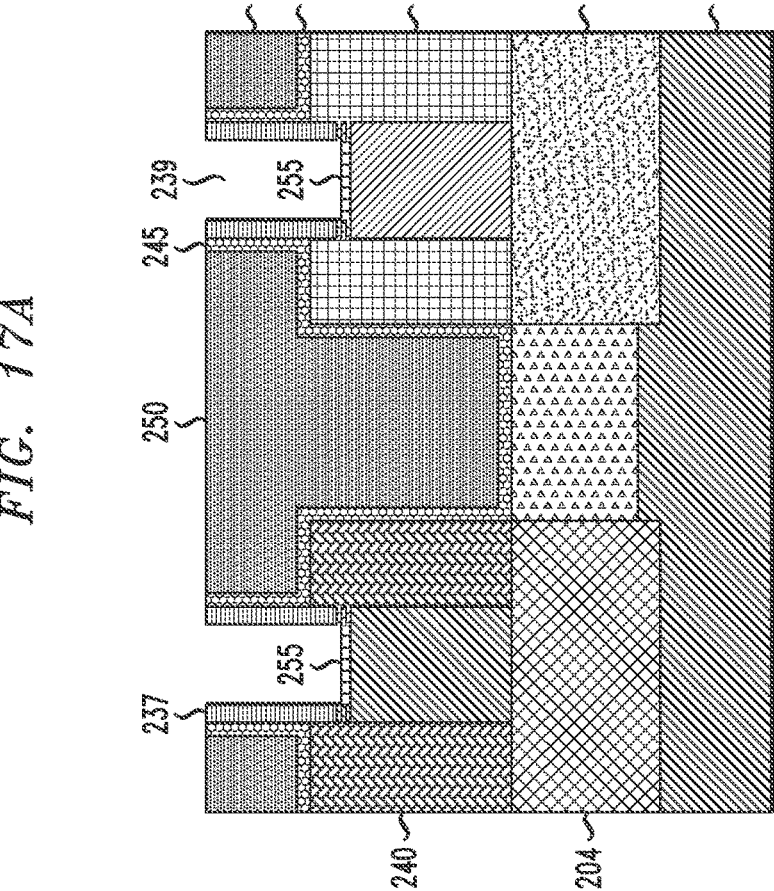
FIG. 17A is a cross-sectional view taken parallel to a fin extension direction and illustrating interfacial layer formation in a method of manufacturing a semiconductor device, according to an exemplary embodiment of the present invention.

FIGS. 17A and 17B are cross-sectional views taken parallel and perpendicular to a fin extension direction, respectively, and illustrating interfacial layer formation in a method of manufacturing a semiconductor device, according to an exemplary embodiment of the present invention. Referring to FIGS. 17A and 17B, interfacial layers 255 are formed on exposed Si and SiGe portions 214 and 216, and on an exposed upper portion of the PTS layer 204. The interfacial layers 255 are formed using a wet ozone (03) based oxidation process with ozone in water to oxidize exposed semiconductor layers 204, 214 and 216. On the exposed silicon semiconductor layers 204 and 214, silicon oxide ($SiO_x$) is formed, and on the exposed SiGe semiconductor layer 216, a mixture of $SiO_x$ and $GeO_x$ (e.g., $SiGeO_x$) is formed. In order to remove the $GeO_x$ from the mixture of $SiO_x$ and $GeO_x$, an $H_2$ anneal process is performed which selectively removes (e.g., scavenges) the $GeO_x$ from the $SiO_x$ and $GeO_x$ mixture. During the $H_2$ anneal, there is no reaction at the interface between the $SiO_x$ and the Si semiconductor portion 214 on the nFET side. After the $H_2$ anneal, there is no $GeO_x$ left in the interfacial layer 255 on the SiGe portion 216 to result in the $SiO_x$ interfacial layer 255 on both Si and SiGe portions 214 and 216, and the exposed upper portion of the PTS layer 204. In accordance with an embodiment of the present invention, the $H_2$ anneal is performed at a temperature of about 600° C. to about 700° C.

Figure 18A:
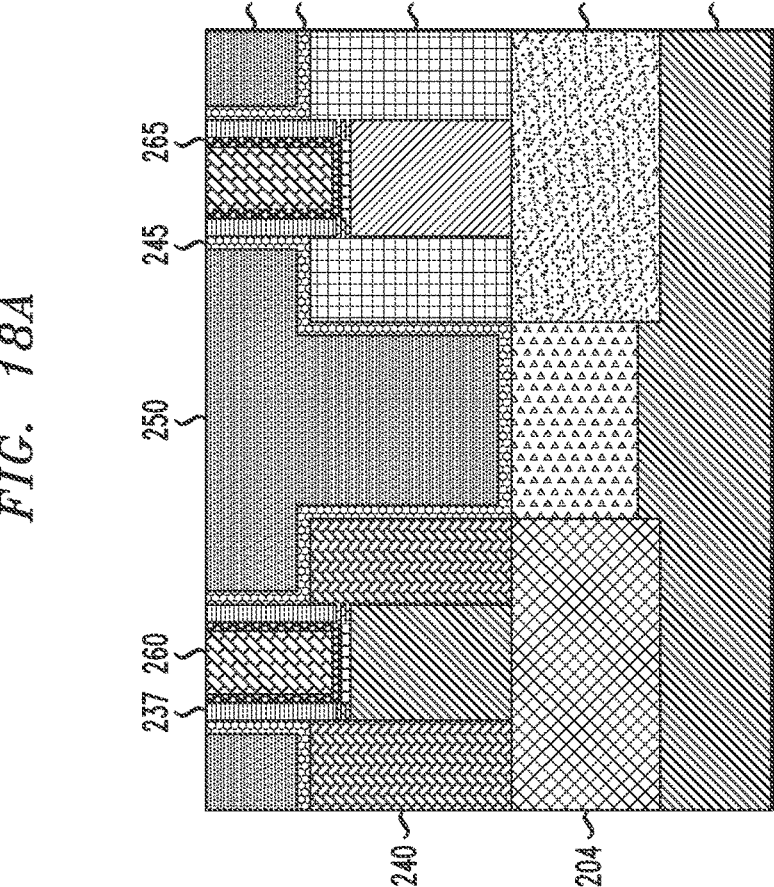
FIG. 18A is a cross-sectional view taken parallel to a fin extension direction and illustrating gate structure formation in a method of manufacturing a semiconductor device, according to an exemplary embodiment of the present invention.

FIGS. 18A and 18B are cross-sectional views taken parallel and perpendicular to a fin extension direction, respectively, and illustrating gate structure formation in a method of manufacturing a semiconductor device, according to an exemplary embodiment of the present invention. Referring to FIGS. 18A and 18B, the gate structures include gate layers 260 and dielectric layers 265. The dielectric layers 265 include, for example, a high-K material including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The gate layers 260 include, for example, a work-function metal (WFM) layer, including but not necessarily limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate layers 260 may further include another conductor including, but not limited to tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. N-type WFMs may be formed separately from p-type WFMs.

The gate structures are deposited in the openings 239 between the spacers 237 and on the interfacial layers 255, as well as on and around the portions of the fins 215 extending above the isolation region 225 and on the surface of the isolation region 225. The gate structures are deposited using, for example, deposition techniques including, but not limited to, CVD, PECVD, RFCVD, PVD, ALD, MLD, MBD, PLD, LSMCD, sputtering, and/or plating. As can be seen in FIG. 18B, due to the shorter height of the isolation region 225 in the nFET region, a PTS layer 204 extends deeper into the gate structure than the PTS layer 206, which avoids parasitic channel formation at the bottom of the channel portion 214.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor structure comprising:
a plurality of fins disposed on a substrate, respective fins of the plurality of fins comprising:
a silicon germanium core portion; and
a silicon germanium surface portion, wherein the silicon germanium surface portion has a lower concentration of germanium than the silicon germanium core portion;
wherein the respective fins comprise respective channel regions of respective transistors of a plurality of transistors; and
a plurality of source/drain regions of the respective transistors, wherein respective top source/drain regions of the plurality of source/drain regions are disposed on the respective fins and wherein respective bottom source/drain regions of the plurality of source/drain regions are disposed adjacent to and contacting the respective fins and comprise:
a doped silicon germanium portion; and
a germanium condensed portion disposed on the doped silicon germanium portion.

2. The semiconductor structure according to claim 1, wherein a subset of the plurality of source/drain regions comprises at least one bottom source/drain region disposed adjacent a base portion of at least one fin of the plurality of fins.

3. The semiconductor structure according to claim 1, wherein a subset of the plurality of source/drain regions comprises at least one top source/drain region disposed on top of at least one fin of the plurality of fins.

4. The semiconductor structure according to claim 3, wherein part of a germanium condensed portion corresponding to the at least one top source/drain region contacts part of a silicon germanium surface portion corresponding to the at least one fin.

5. The semiconductor structure according to claim 1, wherein a concentration of germanium in the germanium condensed portion is higher than a concentration of germanium in the doped silicon germanium portion.

6. The semiconductor structure according to claim 1, further comprising one or more contact layers disposed on respective ones of the germanium condensed portions.

7. The semiconductor structure according to claim 6, further comprising one or more liner layers disposed between the one or more contact layers and the respective ones of the germanium condensed portions.

8. The semiconductor structure according to claim 1, further comprising a gate structure disposed on at least part of respective ones of the silicon germanium surface portions.

9. The semiconductor structure according to claim 8, wherein the gate structure comprises a gate layer and a dielectric layer.

10. The semiconductor structure according to claim 1, further comprising a spacer layer disposed on at least part of respective ones of the silicon germanium surface portions.

11. A semiconductor structure comprising:
a plurality of fins disposed on a substrate, respective fins of the plurality of fins comprising:
a silicon germanium core portion; and
a silicon germanium surface portion on a surface of the silicon germanium core portion, wherein the silicon germanium surface portion has a lower concentration of germanium than the silicon germanium core portion;
wherein the respective fins comprise respective channel regions of respective transistors of a plurality of transistors; and
a plurality of source/drain regions of the respective transistors, wherein respective top source/drain regions of the plurality of source/drain regions are disposed on the respective fins and wherein respective bottom source/drain regions of the plurality of source/drain regions are disposed adjacent to and contacting the respective fins and comprise:
a doped silicon germanium portion; and
a germanium condensed portion disposed on the doped silicon germanium portion.

12. The semiconductor structure according to claim 11, wherein a subset of the plurality of source/drain regions comprises at least one bottom source/drain region disposed adjacent a base portion of at least one fin of the plurality of fins.

13. The semiconductor structure according to claim 11, wherein a subset of the plurality of source/drain regions comprises at least one top source/drain region disposed on top of at least one fin of the plurality of fins.

14. The semiconductor structure according to claim 13, wherein part of a germanium condensed portion corresponding to the at least one top source/drain region contacts part of a silicon germanium surface portion corresponding to the at least one fin.

15. The semiconductor structure according to claim 11, wherein a concentration of germanium in the germanium condensed portion is higher than a concentration of germanium in the doped silicon germanium portion.

16. The semiconductor structure according to claim 11, further comprising one or more contact layers disposed on respective ones of the germanium condensed portions.

17. The semiconductor structure according to claim 16, further comprising one or more liner layers disposed between the one or more contact layers and the respective ones of the germanium condensed portions.

18. The semiconductor structure according to claim 11, further comprising a gate structure disposed on at least part of respective ones of the silicon germanium surface portions.

19. The semiconductor structure according to claim 18, wherein the gate structure comprises a gate layer and a dielectric layer.

20. The semiconductor structure according to claim 11, further comprising a spacer layer disposed on at least part of respective ones of the silicon germanium surface portions.

* * * * *